United States Patent [19]

Eytcheson

[11] 4,215,360
[45] Jul. 29, 1980

[54] POWER SEMICONDUCTOR DEVICE ASSEMBLY HAVING A LEAD FRAME WITH INTERLOCK MEMBERS

[75] Inventor: Charles T. Eytcheson, Macy, Ind.

[73] Assignee: General Motors Corporation, Detroit, Mich.

[21] Appl. No.: 959,340

[22] Filed: Nov. 9, 1978

[51] Int. Cl.² ............... H01L 23/48; H01L 29/44; H01L 29/52

[52] U.S. Cl. .................... 357/70; 357/68; 357/72; 357/79; 357/81; 29/588; 29/589; 29/591; 29/575; 174/52 PE

[58] Field of Search .............. 357/68, 70, 79, 72; 29/577 R, 588, 589, 590, 591, 575; 174/52 PE

[56] References Cited

U.S. PATENT DOCUMENTS

| | | | |
|---|---|---|---|
| 3,258,662 | 6/1966 | Fleming | 357/81 |
| 3,434,018 | 3/1969 | Boczar et al. | 357/81 |
| 3,449,506 | 10/1969 | Weinstein | 357/81 |
| 3,466,467 | 9/1969 | Houcke et al. | 307/315 |
| 3,686,541 | 8/1972 | Livezey et al. | 357/79 |
| 3,689,683 | 9/1972 | Daletto et al. | 357/70 |
| 3,922,712 | 11/1975 | Stryker | 357/70 |
| 4,066,839 | 1/1978 | Cossutta et al. | 357/70 |
| 4,084,312 | 4/1978 | Kirk et al. | 357/70 |
| 4,143,508 | 3/1979 | Ohno | 357/70 |

Primary Examiner—Andrew J. James
Attorney, Agent, or Firm—Robert J. Wallace

[57] ABSTRACT

A power semiconductor device package is made using a subassembly of a die mount substrate and a lead frame. The subassembly is interlocked in a manner that permits relative movement without losing alignment. A method is described in which the lead frame interlock has a first position to facilitate making electrical interconnections. In a second position, package encapsulation is facilitated. In a preferred embodiment the lead frame interlocks with an element lightly press fitted in package mount holes in the die mount substrate. After package encapsulation, the interlock element is pressed out of the substrate to separate unused parts of the lead frame from the package and to make the substrate holes available for package mount.

7 Claims, 13 Drawing Figures

POWER SEMICONDUCTOR DEVICE ASSEMBLY HAVING A LEAD FRAME WITH INTERLOCK MEMBERS

BACKGROUND OF THE INVENTION

This invention relates to assembly of high power semiconductor devices. More particularly it relates to a lead frame-die mount substrate used in such assembly.

High power semiconductor devices are typically made by mounting a semiconductive device die on a heat conductive substrate. Contact areas of the die are interconnected with terminal leads. In the resultant device package, the leads extend outside a housing surrounding the die and interconnections. The leads can initially be part of a lead frame. In some instances, as for example U.S. Pat. No. 3,922,712 Stryker, entitled "Plastic Power Semiconductor Flip Chip Package", issued Nov. 25, 1975 to the assignee of this invention, the lead frame and die mount substrate are attached together as a subassembly. They are locked together with the finger leads of the frame and the die mount area on the substrate in alignment. The two can readily be handled as a single element during processing. U.S. Pat. No. 3,922,712 Stryker discloses a particular technique such as this that is useful in manufacturing packages having a flip chip die. Other subassemblies are known for use with dies requiring pressure bonded filamentary wire interconnections.

I have now discovered a new type of subassembly interlock that is particularly useful in making device packages requiring pressure bonding of filamentary wires to thin finger leads of a lead frame.

OBJECTS AND SUMMARY OF THE INVENTION

It is, therefore, an object of this invention to provide a die mount substrate for use in assembling power semiconductor devices having an improved interlock means with a lead frame.

Another object of the invention is to provide an improved method of assembling power semiconductor integrated circuit packages.

These and other objects of the invention are obtained using a unique movable die mount substrate-lead frame interlock. The interlock member is nested within an opening in the die mount substrate. It is frictionally retained in the opening and movable to more than one position therein without losing alignment with the die on the substrate. The substrate and lead frame are initially interlocked with finger leads of the lead frame positioned against the substrate for reinforcement during wire bonding. After wire bonding the interlock means is moved to a second position, where it holds the lead frame fingers spaced from the substrate for encapsulation into a device package. After encapsulation, the lead frame interlock means is removed from the substrate openings, making these openings available for subsequent use as package mounting holes. In a preferred example the lead frame interlock is a conformation on the substrate in a mounting hole area. The substrate is sheared thru around the conformation to provide a substrate hole. However, the sheared metal is not removed. It is pressed in the hole to frictionally retain it in place. It is, therefore, axially movable in the hole, to move the lead frame and the substrate with respect to each other and not lose alignment.

BRIEF DESCRIPTION OF THE DRAWING

Other objects, features and advantages of the invention will become apparent upon reading the following detailed description and upon reference to the drawings, in which.

DESCRIPTION OF THE PREFERRED EMBODIMENTS

Figure 1A:
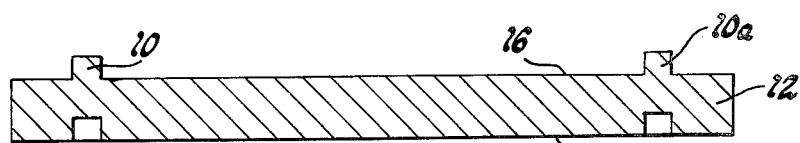
FIGS. 1a, 1b and 1c show sectional views of a die mount substrate in successive stages of formation.
Figure 1B:
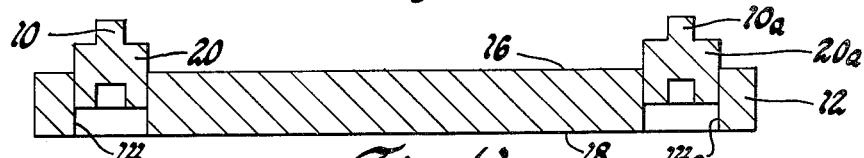

FIG. 1 shows two cylindrical lead frame interlock embossments 10 and 10a on a rectangular flat cover plate of about 3–5 millimeters thick, preferably at least 4 millimeters thick. However, greater thicknesses can be used, as will hereinafter be described. The cylindrical conformation of the embossments 10 and 10a can be formed by coining or the like. Substrate 12 is completely sheared through in a circle around embossments 10 and 10a, as shown in FIG. 1b, resulting in two spaced apart cylindrical passages 14 and 14a. Passages 14 and 14a are linear and parallel. They interconnect substrate opposite surfaces 16 and 18. They are located in the substrate to provide mounting holes for the finished package produced by the process of this invention. However, in addition they are in known location with respect to a die mount area on the substrate. In forming passages 14 and 14a, the metal sheared from substrate 12 underlying embossments 10 and 10a respectively form discrete cylindrical columnar elements 20 and 20a.

Figure 1C:
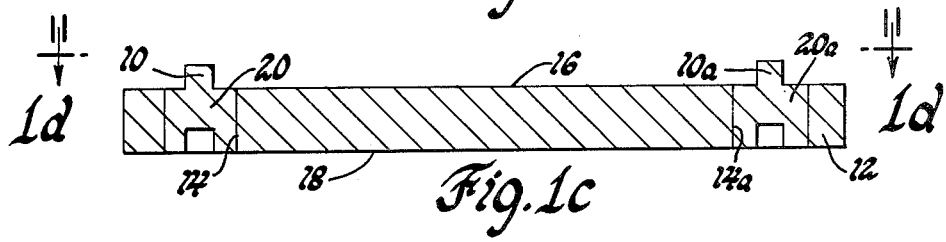
Figure 1D:
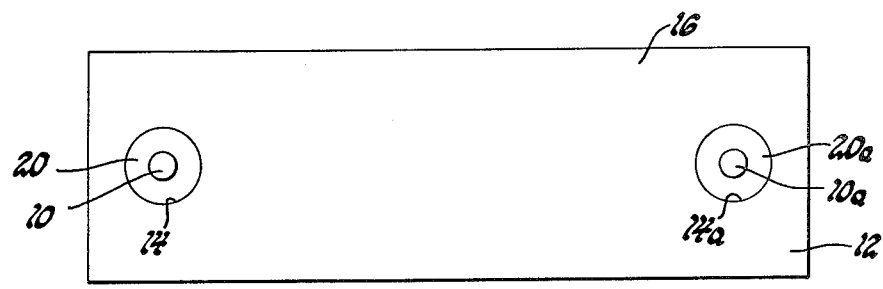
FIG. 1d shows a plan view along the line d—d of FIG. 1c.

Elements 20 and 20a are preferably not completely punched out of substrate 12 when formed. Instead, they are only partially punched out, sufficient to insure the substrate metal is substantially severed. Then they are pressed back into their respective passages 14 and 14a. They can then be coined, if necessary, to insure a close fitting relationship in their respective passages that frictionally retains them therein. The press fit is preferably tight enough to hold the elements in place along the passage axis even while they are supporting the lead frame. However, they are not so tight as to induce deleterious strain in the substrate when they are moved. Elements 20 and 20a are self-supporting within their respective passages 14 and 14a, as shown in FIGS. 1c and 1d. The substrate as shown in FIG. 1d is then preferably annealed under normal and accepted conditions. Anneal will remove any strain introduced into the substrate by the aforementioned steps, which might be subsequently transferred to the die mounted on it. It is also understood that passages 14 and 14a can be formed by boring holes in substrate 12. In such instance, interlock elements 20 and 20a would have to be separately formed, as by machining or the like, and then press fitted in place. Further, it is recognized that elements 20 and 20a could be placed in substrate 12 after die mount. However, this is not desirable. It introduces strain in the substrate at a point in processing when it cannot be satisfactorily annealed out.

Figure 2:
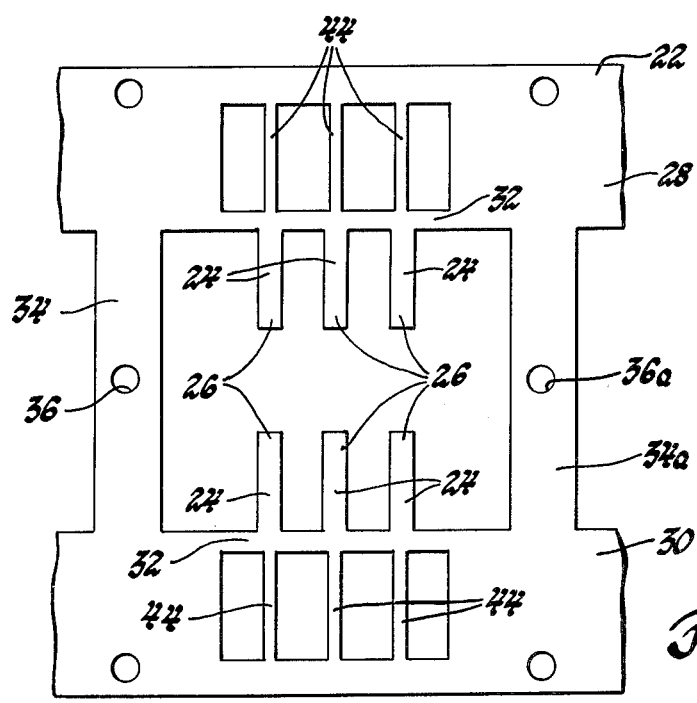
FIG. 2 shows a fragmentary plan view of a lead frame strip that can be used with the substrate of FIGS. 1a–1d.

Substrate 12 is then assembled with a rather conventional locking ladder-like lead frame strip 22. Lead frame 22 can be a flat strip of any convenient length. It contains a repetitive pattern of finger leads 24 having inwardly converging free ends 26. For simplicity, only one such pattern is shown in FIG. 2. Finger leads 24 extend inwardly from parallel rails 28 and 30. They are maintained mutually spaced by web portions 32. Rails 28 and 30 have transverse cross members 34 and 34a on opposite sides of finger leads 24. Cross members 34 and 34a are spaced apart about the same distance as passages 14 and 14a in substrate 12. Cross members 34 and 34a have apertures 36 and 36a therein for respectively receiving conformations 10 and 10a of substrate 12 in a close fitting relationship. Apertures 36 and 36a are in predetermined location on lead frame 22 with respect to the free ends 26 on the finger leads. Analogously, conformations 10 and 10a on substrate 12 are in predetermined location with respect to a die mount area on surface 16 of substrate 12. These predetermined locations are related so that free ends 26 are aligned with the substrate die mount area when apertures 36 and 36a are fitted onto conformations 10 and 10a. A separate die mount substrate is so fitted to each repetitive finger lead pattern in the lead frame strip 22.

Figure 3:
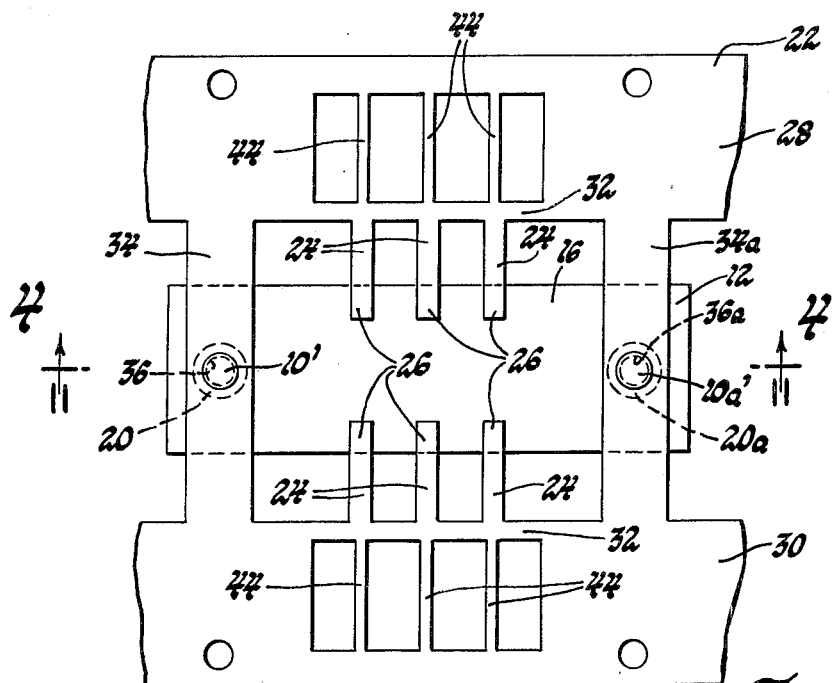
FIG. 3 shows a subassembly of the lead frame and substrate.
Figure 4:
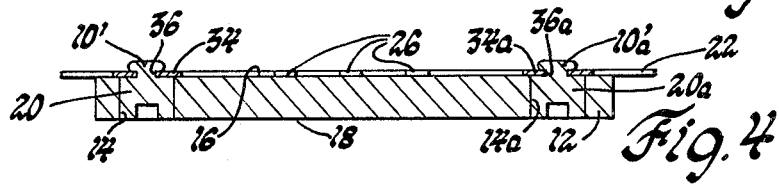
FIG. 4 shows a sectional view along the line 4—4 of FIG. 3.

In assembling lead frame 22 with substrate 12, holes 36 and 36a are registered with substrate conformations 10 and 10a respectively, while interlock elements 20 and 20a are disposed as shown in FIG. 1c. As shown in FIGS. 3 and 4, the lead frame is then placed directly on surface 16 of substrate 12. The upper ends of conformations 10 and 10a projecting through apertures 36 and 36a are then flattened, to rivet the lead frame to interlock elements 20 and 20a. The lead frame 22 is now in predetermined location on substrate 12, with finger-free ends 26 in predetermined location with respect to a die mount area on surface 16 of substrate 12. Thus, lead frame 22 is mechanically fastened to interlock elements 20 and 20a by flattened conformations 10' and 10a'. It should be recognized that the lead frame and interlock elements can be aligned and secured together in other ways. For example, other means, such as notches and tangs, can be used. The conformations and recesses could be reversed. Soldering, crimping, etc., can be used for fastening. In any event, interlock elements 20 and 20a are frictionally retained in substrate 12 and lead frame 22 is thereby also fastened to substrate 12. Care is taken to avoid inducing any particularly deleterious strain on the lead frame, columnar elements, or substrate while this subassembly is being formed. A following anneal may be undesirable.

A semiconductor device die 38 containing a power transistor or the like is then mounted by soldering, adhesive bonding or the like at a preselected location on the substrate surface 16 in alignment with the finger leads. The die mount area is in preselected location with respect to the lead frame. Contact areas on the die are aligned with their respective finger leads. If desired, a rectangular die mount pedestal (not shown) could be formed on surface 16 of the substrate 12 at an earlier step in processing. The pedestal can be similar to that shown in the aforementioned U.S. Pat. No. 3,922,712 Stryker, filed Sept. 24, 1973 and assigned to the assignee of this invention, and the die 38 mounted on the pedestal in essentially the same way. Use of the pedestal may permit automatic die alignment during solder bonding.

Figure 5:
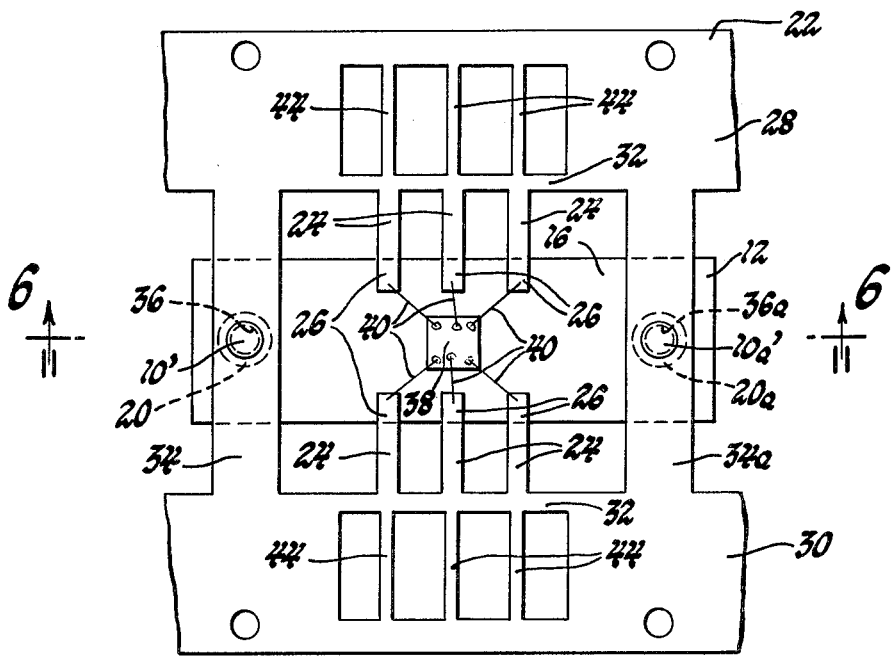
FIG. 5 shows a plan view of the FIG. 3 subassembly after die mount and wire bonding.
Figure 6:
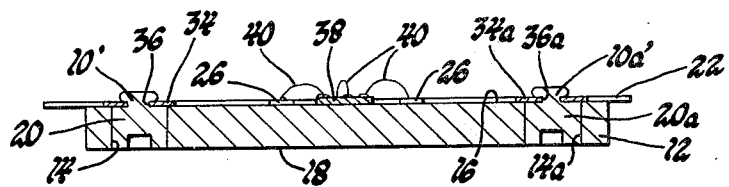
FIG. 6 shows a sectional view along the line 6—6 of FIG. 5.
Figure 7:
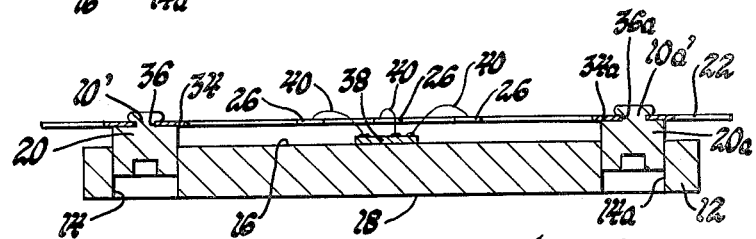
FIG. 7 shows the FIGS. 5 and 6 assembly after interlock movement and substrate-lead frame spacing.

After the die 38 is mounted, filamentary gold or aluminum wires are then pressure bonded between the finger-free ends and corresponding metal contact pads on the semiconductor die such as shown in FIG. 5. Since the lead frame is aligned with contact areas on the die, the lead frame can provide automatic alignment in an automatic wire bonder. The wire filaments are of an appropriate diameter to handle the current involved. They are generally of about 5 mils in diameter but can be appreciably larger in size, for example up to about 25 mils in diameter. Thermocompression bonding, ultrasonic bonding, or the like, can be used as the pressure bonding process. Finger-free ends 26 are reinforced during pressure bonding by the underlying surface 16 of substrate 12. Consequently, thin finger leads can be used and no intricate finger lead support need be provided during bonding. The bonding can be performed in the normal and accepted manner. This includes forming a semicircular loop of the wire filaments 40 between the finger-free end and its associated die contact pad, as seen in FIG. 6. No exceptionally large loop is necessary. Only sufficient filament length need be incorporated in the loop to permit the substrate to be raised the predetermined distance shown in FIG. 7. In many instances, normal wire bonding techniques will readily permit such movement. However, if desired, an appropriate additional length can be provided in the filamentary wire loop. The additional length desired will be a function of how high it is desired to raise the lead frame and the die contact-free end spacing.

Interlock elements 20 and 20a are then pressed halfway out of their recesses 14 and 14a so that lead frame 22 is spaced up above surface 16 on substrate 12. This tends to shorten the loops in filamentary wires 40. The extent of movement need only be a millimeter or so. In essence, the movement need only be enough to insure that the finger leads and the substrate are not in low resistance contact, i.e. shorted, and that the encapsulating material will flow between them. A substrate-finger spacing of about only 1 or 2 millimeters should be acceptable. The maximum distance elements 20 and 20a are moved here, of course, should be less than that which will cause filamentary wires 40 to be detrimentally stretched. It is preferred that sufficient wire length be included in the loops of filamentary wires shown in FIG. 6 so that when the lead frame 22 is moved to the position shown in FIG. 7, the wire loops will still not be strained. In most instances, I prefer that the interlock elements not be separated from the substrate and separately held in place during encapsulation. Hence, the substrate preferably should have sufficient thickness to still retain the interlock elements after they have been moved. If they are moved 5–10 millimeters, the substrate should be correspondingly thicker and filamentary wire loops correspondingly larger.

Figure 8:
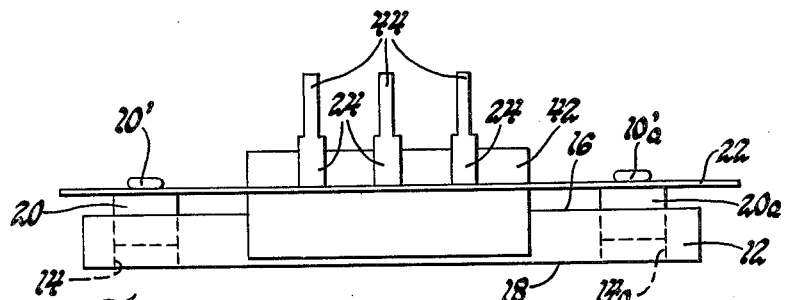
FIGS. 8 and 9 show elevational side views of the package formed from the FIG. 7 assembly, respectively, before and after lead frame separation.
Figure 9:
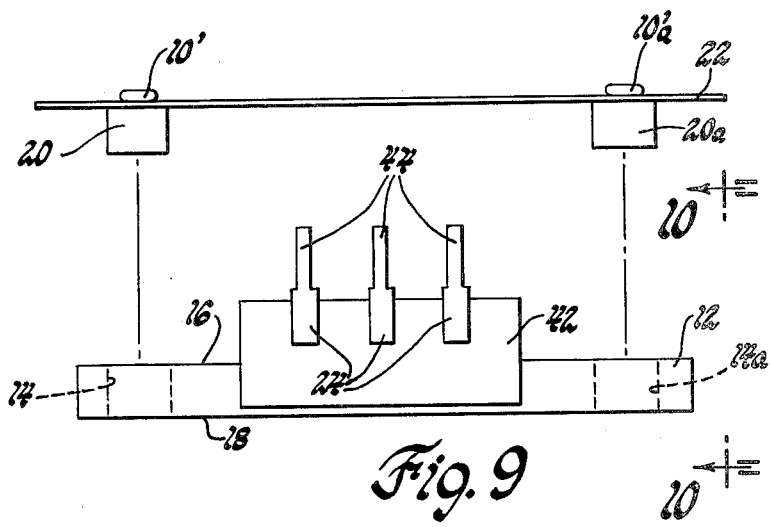
Figure 10:
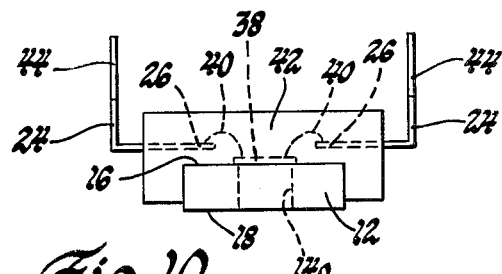
FIG. 10 shows an elevational end view of the separated package, along the line 10—10 of FIG. 9.

Once moved, press fitted interlock elements 20 and 20a retain lead frame 22 spaced from surface 16 of substrate 12. A housing 42 can now be formed around chip 38, filamentary wires 40 and finger ends 26 between substrate passages 14 and 14a. The housing can be formed in any convenient manner, as for example, by plastic encapsulation processes in the normal and accepted manner. Injection molding, for example, can be used. In such processing, finger leads 24 extend from the die mount area through housing 42 to the outside world. The outer ends 44 of fingers 24 are then severed from the lead frame, along with interconnecting web portions 32, to provide a plurality of discrete finger leads. Concurrently, if desired, these leads can be bent out of the plane of the strip, as shown in FIG. 8. This produces a discrete semiconductor device package that is essentially complete, except for separation from the severed lead frame portions. Once the finger outer portions 44 are severed from lead frame 22, the lead frame 22 is connected to the package through the interlock between press fitted members 20 and 20a and lead frame cross members 34 and 34a.

The interlock elements 20 and 20a are then completely pressed out of their respective passages 14 and 14a to completely separate lead frame 22 from substrate 12 and the semiconductor device package it comprises. Lead frame 22 is discarded, along with its attached interlock members 20 and 20a. Upon such separation, passages 14 and 14a in the substrate 12 become available as mounting holes for the finished device package.

The embodiments of the invention in which a exclusive property or privilege is claimed are defined as follows:

1. In a method of assembling a power semiconductor device die in a package using an interlocked die mount substrate and aligned terminal lead frame, the improvement comprising attaching the lead frame to an interlock means movable on the substrate, confining interlock movement to only one plane for maintaining alignment, positioning the interlock to locate the lead frame in a first substrate position that facilitates electrically interconnecting frame leads to said die, moving the interlock in said plane to locate the lead frame in a second position for encapsulating the die and inner parts of frame leads as a package adjacent said interlock, separating outer parts of said leads from the balance of said frame, and further moving said interlock means in said plane to disengage it from said substrate, whereby said frame balance is separated from said package.

2. In a method of assembling and wire bonding a power semiconductor device die in a package using an interlocked die mount substrate-lead frame subassembly, the improvement comprising disposing a lead frame interlock means in a substrate passage that is substantially perpendicular to a die mount surface on the substrate, said interlock means being only longitudinally movable in said passage, rigidly attaching the lead frame to the interlock means, locating the interlock along said passage to place finger leads of said frame against said substrate surface for reinforcement during wire bonding, moving the interlock partially out of the substrate passage after wire bonding to space the finger leads from the substrate for die-finger lead encapsulation as a package, and then moving the interlock completely out of the passage to disengage the interlocked lead frame from the package and to make said passage available as a package mounting hole.

3. A method of making a high power semiconductor device package comprising:
providing a movable means on a die mount substrate for interlock with a lead frame, said means being movable in only one substrate plane;
attaching a lead frame to said interlock means in a first predetermined substrate placement wherein said substrate reinforces contact fingers of said frame during electrical interconnection with a semiconductor die on said substrate;
mounting a semiconductor die on said substrate in known location with respect to said interlock means and, thereby, with respect to said fingers;
electrically interconnecting said fingers and element with pressure bonded filamentary wires while so reinforced;
then moving said interlock means with respect to said substrate to obtain a predetermined lead frame-substrate displacement;
enclosing said die and inner portions of said fingers during such displacement, to form a device package;
separating finger outer portions from lead frame support; and
separating remaining portions of said lead frame from said package by removing said interlock means from said substrate.

4. A method of making a high power semiconductor device package comprising the steps of:
nesting an axially movable lead frame interlock element in each of at least two holes in a metal die mount substrate, which holes subsequently serve as package mounting holes;
annealing said substrate to remove metal working stresses therein;
placing inner ends of terminal fingers on a lead from against said substrate for reinforcement while pressure bonding of filamentary wires thereto;
attaching said lead frame to said interlock elements for maintaining finger ends in predetermined disposition on said substrate;
affixing a semiconductor device die to said substrate in known location with respect to said interlock means and finger inner ends;
pressure bonding filamentary wires to said reinforced finger inner ends and to said die;
axially moving said interlock elements in their holes to relocate said lead frame fingers in a second predetermined disposition for enclosing said die, finger ends and filamentary wires;
encapsulating said die, finger inner ends and wires on said substrate to form a device package;
severing outer ends of said terminal fingers from said lead frame to delineate a plurality of discrete terminals of said package; and
moving said interlock elements completely out of their holes to separate them and remaining lead frame portions from said package and to concurrently form mounting holes for said package.

5. A method of making a high power semiconductor device package comprising the steps of:
providing a generally flat metal die mount substrate having at least two spaced apart parallel cylindrical passages connecting opposite substrate surfaces;
frictionally nesting conforming columnar elements in said passages in a first predetermined location, said elements having lead frame interlock conformations thereon;
annealing said substrate to remove metal working stresses;
registering a lead frame on said substrate by means of said element conformations, wherein finger lead inner ends on said frame are aligned with a die mount area on said substrate and are supported by said substrate surface for wire bonding;

affixing a semiconductor device die to one of said surfaces between said passages in a predetermined location with respect to said interlock conformations;

pressure bonding loops of filamentary wires to said finger inner ends and their respective chip contact areas while said ends are so supported;

pressing said interlock elements to a second predetermined location on their passages to supportingly space said finger inner ends from said substrate surface within the limits of said wire loops;

while so spaced, encapsulating said inner ends, wire loops and chip along with substrate portions intermediate said substrate passages to form a device package;

severing outer ends of said fingers from lead frame peripheral portions; and pressing said interlock elements completely out of their passages, whereby said lead frame peripheral portions are separated from said substrate and said substrate passages become available as device package mounting holes.

6. A substrate for assembly of said substrate with a lead frame, said substrate including at least one lead frame locating opening therein, lead frame interlock means nested within said opening for locating said lead frame with respect to said substrate, and lead frame interlock means frictionally retained but movable to more than one position in said opening, whereby said substrate and said lead frame are movable with respect to each other without losing their mutual location.

7. A semiconductor device heat sink for assembly with a lead frame strip wherein said substrate has a recess therein in predetermined location with respect to a chip mounting area on said substrate, and movable lead frame interlock means within said opening for locating said lead frame with respect to said chip mount area, movement of said interlock means in said recess confined to only one plane to permit plural predetermined heat sink-lead frame positions with respect to that plane, and said interlock means frictionally retained in said recess to maintain a predetermined heat sink-lead frame disposition in said plane, once so moved, whereby plural temporary predetermined heat sink-lead frame dispositions are obtained.

* * * * *